United States Patent
Lane et al.

(10) Patent No.: US 9,331,062 B1
(45) Date of Patent: May 3, 2016

(54) INTEGRATED CIRCUITS WITH BACKSIDE POWER DELIVERY

(71) Applicant: Altera Corporation, San Jose, CA (US)

(72) Inventors: Christopher F. Lane, San Jose, CA (US); Arifur Rahman, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/099,792

(22) Filed: Dec. 6, 2013

(51) Int. Cl.
*H01L 23/52* (2006.01)
*H01L 27/02* (2006.01)
*H01L 21/768* (2006.01)

(52) U.S. Cl.
CPC ...... *H01L 27/0207* (2013.01); *H01L 21/76801* (2013.01)

(58) Field of Classification Search
CPC .................. H01L 21/76801; H01L 27/0207
USPC .................... 257/209, 773, E23.011; 438/459
See application file for complete search history.

(56) References Cited

U.S. PATENT DOCUMENTS

| | | | |
|---|---|---|---|
| 6,355,950 B1 | 3/2002 | Livengood et al. | |
| 6,495,454 B2 | 12/2002 | Livengood et al. | |
| 6,569,762 B2 | 5/2003 | Kong | |
| 7,479,401 B2 | 1/2009 | Lai et al. | |
| 7,605,458 B1 * | 10/2009 | Rahman et al. | 257/686 |
| 8,237,274 B1 * | 8/2012 | Rahman | 257/737 |
| 8,405,115 B2 | 3/2013 | Samoilov et al. | |
| 8,803,206 B1 * | 8/2014 | Or-Bach et al. | 257/278 |
| 2002/0020862 A1 * | 2/2002 | Livengood | H01L 21/76898 257/276 |
| 2008/0205008 A1 | 8/2008 | Sun et al. | |
| 2008/0237310 A1 * | 10/2008 | Periaman et al. | 228/180.5 |
| 2011/0248404 A1 * | 10/2011 | Chiu et al. | 257/773 |

* cited by examiner

*Primary Examiner* — Matthew Gordon
(74) *Attorney, Agent, or Firm* — Treyz Law Group, P.C.; Jason Tsai

(57) ABSTRACT

Integrated circuits with backside power delivery capabilities are provided. An integrated circuit may include a substrate having front and back surfaces, a first interconnect stack formed on the front surface, and a second interconnect stack formed on the back surface. Routing structures that carry data signals, control signals, and other user signals may be formed only in the first interconnect stack. A large majority of routing structures that carry power supply signals may be formed in the second interconnect stack. Decoupling capacitor circuitry such as deep trench capacitors may be formed in the back surface of the substrate. The integrated circuit may be mounted on a package substrate. The first interconnect stack may be coupled to the package substrate via wire bond pads, whereas the second interconnect stack may be coupled to the package substrate via an array of solder bumps.

16 Claims, 7 Drawing Sheets

INTEGRATED CIRCUITS WITH BACKSIDE POWER DELIVERY

BACKGROUND

This relates generally to integrated circuits, and more particularly, to ways of distributing power in programmable integrated circuits.

Programmable integrated circuits are a type of integrated circuit that can be programmed by a user to implement a desired custom logic function. In a typical scenario, a logic designer uses computer-aided design (CAD) tools to design a custom logic circuit. When the design process is complete, the tools generate configuration data. The configuration data is loaded into memory elements (sometimes referred to as configuration memory cells) to configure the device to perform the functions of the custom logic.

During normal operation of a programmable device, loaded configuration memory cells produce static output signals that are applied to the gates of transistors (i.e., pass transistors). The configuration memory cell output signals turn some pass transistors on and turn other pass transistors off. This selective activation of pass transistors on the programmable device customizes the operation of the device so that the device performs its intended function.

Programmable integrated circuits typically include a large amount of logic resources so as to be able to accommodate a wide range of user applications. As a result, programmable integrated circuits have a complex interconnect fabric for routing user signals on and off chip. At the same time, it is important to supply power evenly to each of the logic resources without suffering from undesired IR drop. As the amount of logic resources and the power density per unit area increases with each new generation of semiconductor devices, it becomes increasing challenging to route the user signals and to supply power supply voltages to the different logic resources on a programmable integrated circuit without increasing cost.

SUMMARY

This relates generally to integrated circuit packages and more particularly, to integrated circuit packages that include an integrated circuit with backside power delivery capabilities. An integrated circuit may, for example, include a substrate having front and back surfaces, a first interconnect stack formed on the front surface of the substrate, and a second interconnect stack formed on the back surface of the substrate. The second interconnect stack may include only power supply routing circuitry, whereas the first interconnect stack may include mostly circuitry for routing data signals, control signals, and other toggling user signals to the integrated circuit.

Transistors and other active circuitry may be formed at the front surface of the substrate. A through-bulk via structure may be formed in the substrate that serves to convey power supply signals to at least one of the transistors. In particular, the through-bulk via structure may have a first end that directly contacts the source-drain diffusion region associated with at least of the transistors and a second end that is coupled to the power supply routing circuitry in the second interconnect stack. In some embodiments, decoupling capacitor circuitry such as deep trench capacitors may be formed in the back surface of the substrate.

The integrated circuit may be mounted on an additional substrate (e.g., a package substrate or an interposer substrate). Routing structures in the first interconnect stack may be coupled to the additional substrate via wire bonding, whereas the power supply routing circuitry in the second interconnect stack may be coupled to the additional substrate through solder bumps formed between the integrated circuit and the additional substrate.

Further features of the present invention, its nature and various advantages will be more apparent from the accompanying drawings and the following detailed description.

DETAILED DESCRIPTION

Embodiments of the present invention relate to integrated circuits and more particularly, to ways of delivering power supply voltages to an integrated circuit. It will be recognized by one skilled in the art, that the present exemplary embodiments may be practiced without some or all of these specific details. In other instances, well-known operations have not been described in detail in order not to unnecessarily obscure the present embodiments.

In conventional integrated circuits, circuits such as transistors are formed in a silicon substrate having a front surface. Interconnect routing layers are formed on the front surface of the silicon substrate. Data and control signals, as well as power supply voltage signals, are routed through metal paths formed in the front-side interconnect routing layers. Formed in this way, metal paths that serve to route the data and control (or user) signals and metal paths that serve to route the power supply voltage signals compete for the limited routing space in the interconnect routing layers.

As device scaling continues to allow for increases in the number of transistors per unit area, the requirements for routing resources and power consumption become increasingly challenging to satisfy. For example, it is becoming increasingly difficult to route the user signals and power supply voltage signals to all the circuits on an integrated circuit without substantially increasing cost. It may therefore be desirable to provide an improved way of routing user and power supply signals in an integrated circuit.

Figure 1:
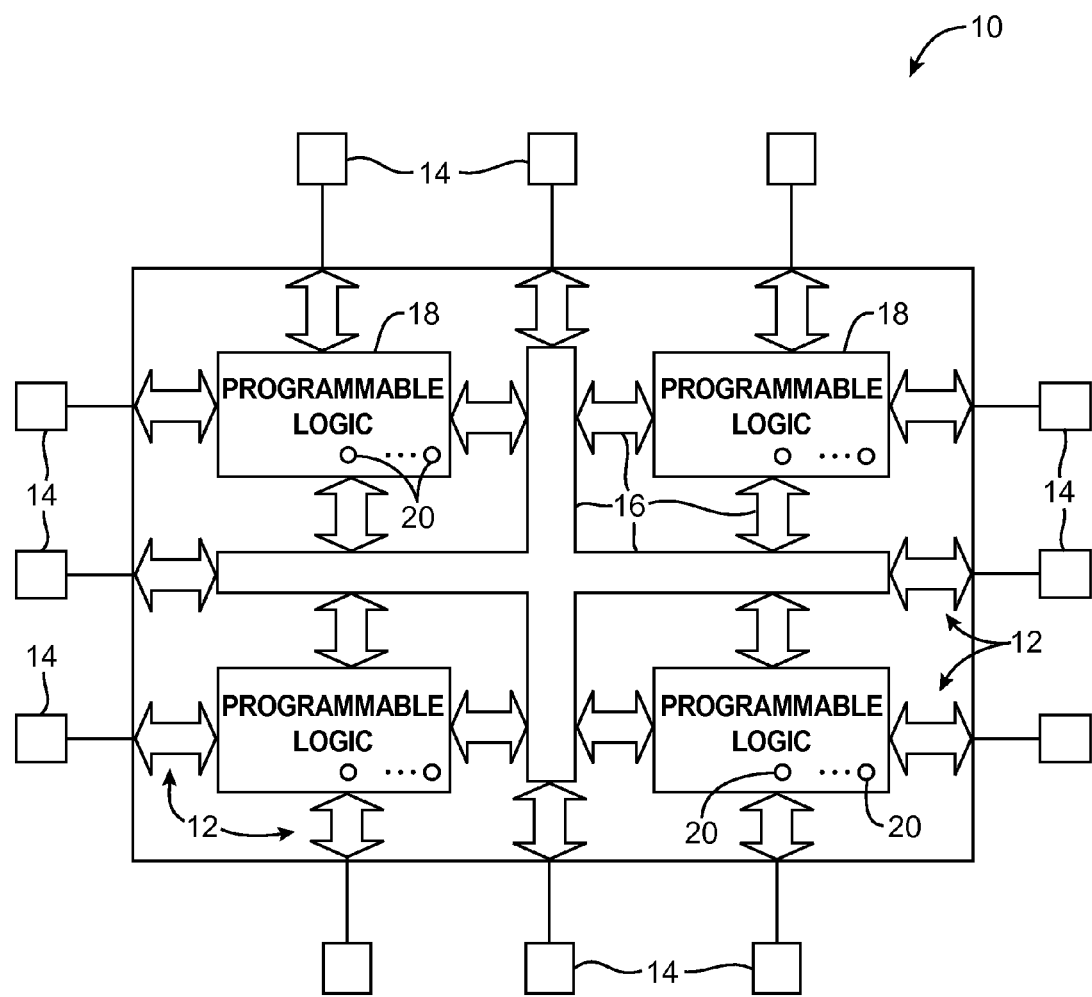
FIG. 1 is a diagram of an illustrative programmable integrated circuit in accordance with an embodiment.

In accordance with an embodiment, an integrated circuit may include active circuitry formed in a substrate, a first set of routing layers on the front (top) side of the substrate for routing user signals, and a second set of routing layers on the back (bottom) side of the substrate for routing power to the active circuitry. Separating the user signal routing from the power routing can substantially reduce the routing complexity in the integrated circuit. An integrated circuit such as integrated circuit 10 that can be implemented using this backside power routing arrangement is shown in FIG. 1. As shown in FIG. 1, integrated circuit 10 may contain memory elements 20. Memory elements 20 may be loaded with configuration data to configure programmable transistors such as pass transistors (sometimes referred to as pass gates or pass gate transistors) in programmable circuitry (programmable logic) 18.

Because memory elements 20 may be used in storing configuration data for programmable logic 18, memory elements 20 may sometimes be referred to as configuration random-access memory elements (CRAM). Integrated circuit 10 may be configured to implement custom logic functions by configuring programmable logic 18, so integrated circuit 10 may sometimes be referred to as a programmable integrated circuit.

As shown in FIG. 1, programmable integrated circuit 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 may include fixed interconnects (conductive lines) and programmable interconnects (i.e., programmable connections between respective fixed interconnects).

Programmable logic 18 may include combinational and sequential logic circuitry. Programmable logic 18 may be configured to perform a custom logic function. The programmable interconnects associated with interconnection resources 16 may be considered to form a part of programmable logic 18.

When memory elements 20 are loaded with configuration data, the memory elements each provide a corresponding static control output signal that controls the state of an associated logic component in programmable logic 18. Configuration random-access memory elements 20 may be arranged in an array pattern. There may be, for example, millions of memory elements 20 on integrated circuit 10. During programming operations, the array of memory elements is provided with configuration data. Once loaded with configuration data, memory elements 20 may selectively control (e.g., turn on and off) portions of the circuitry in the programmable logic 18 and thereby customize the circuit functions of circuit 10.

Figure 2:
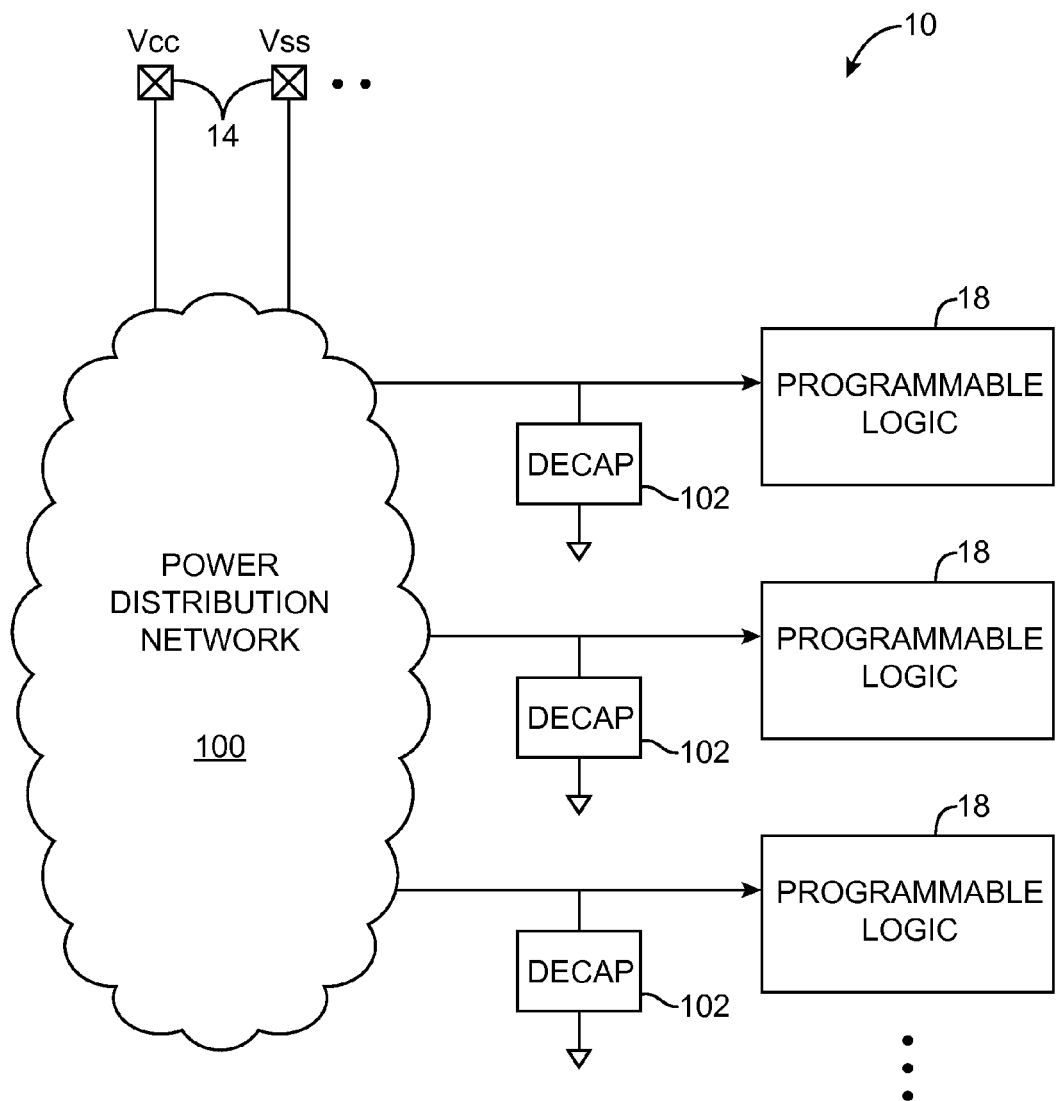
FIG. 2 is a diagram showing how power can be distributed to various logic regions on an integrated circuit in accordance with an embodiment.

FIG. 2 is a diagram showing how power may be supplied to different parts of programmable integrated circuit 10. As shown in FIG. 2, a power supply voltage such as positive power supply voltage Vcc and ground power supply voltage Vss that are received externally through at least two of input-output pins 14 may be distributed to different logic regions (e.g., Vcc and Vss may be supplied to programmable logic 18 located at respective regions) on device 10 via a power distribution network 100. Network 100 may include vertical and horizontal conductive routing paths that span substantially all of device 10 or only part of device 10.

Network 100 may, for example, be optimized to provide power to various portions of device 10 while minimizing IR (voltage) drop. Ground power supply voltage Vss and other suitable externally-applied voltage signals (i.e., biasing signals received via pins 14) or internally-generated voltage signals (i.e., biasing signals generated on-chip using voltage regulators) may also be distributed using this approach.

It is generally desirable to maintain the power supply voltages at constant voltage levels (e.g., to minimize power supply voltage variation). The amount of power drawn from the power supply may vary during normal operation of an integrated circuit. To accommodate this type of changing power demand while maintaining constant power supply voltage levels, device 10 may include decoupling capacitor circuitry. The decoupling capacitor circuitry may serve as a local energy storage reserve that provides instantaneous current draw. Providing current using the decoupling capacitor circuitry may reduce power supply noise.

Consider another scenario in which the positive power supply experiences an instantaneous voltage glitch. Decoupling capacitor blocks 102 may dampen or absorb this glitch by providing instantaneous current to internal circuitry so that the positive power supply voltage received at the local power supply terminal of the internal circuitry remains constant at 0.85 V (as an example). Decoupling capacitor circuitry used to maintain constant power supply voltage while supplying the desired current draw may sometimes be referred to as a ballasting circuit.

Figure 3:
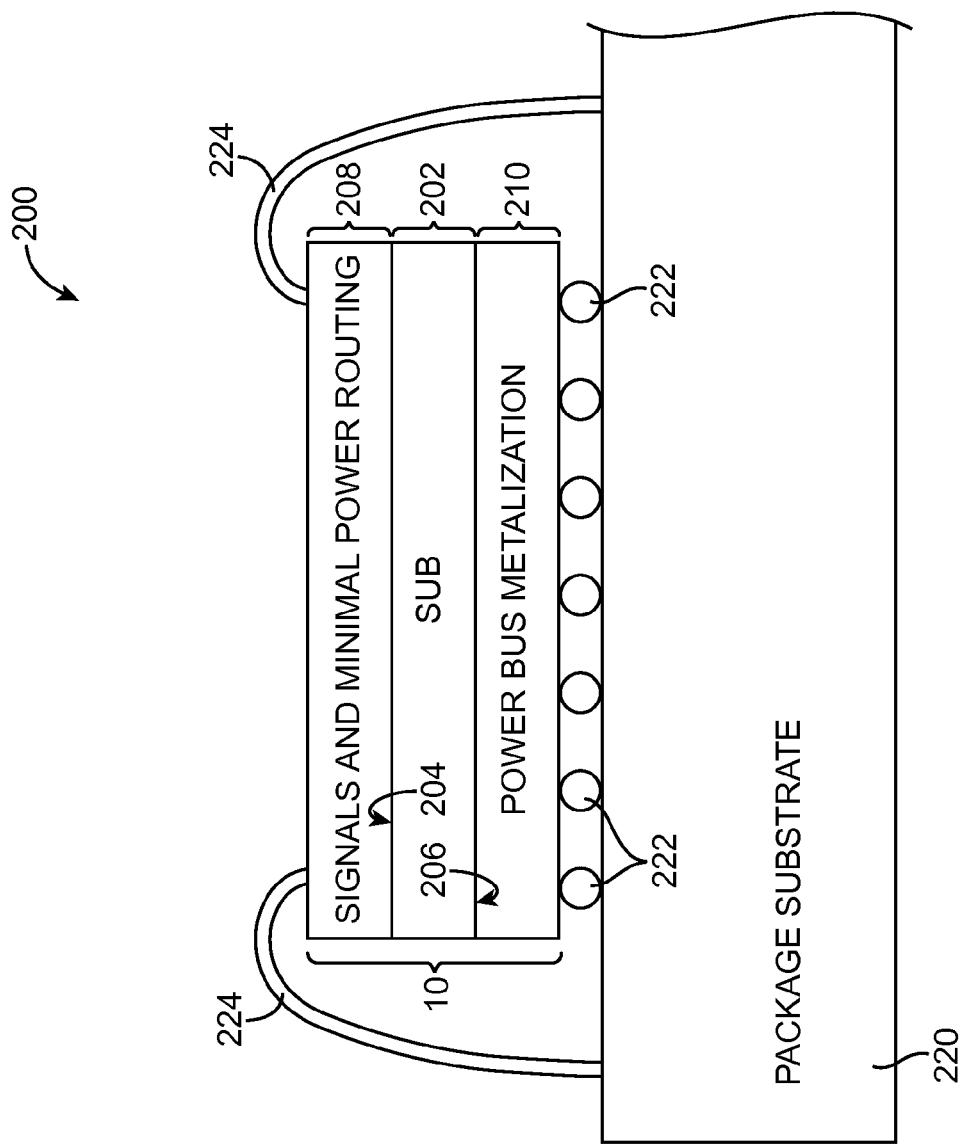
FIG. 3 is a cross-sectional side view of a single-chip package that includes an integrated circuit with signal routing formed on the front side of the integrated circuit and power routing formed on the back side of the integrated circuit in accordance with an embodiment.

In accordance with an embodiment, power distribution network 100 and decoupling capacitor circuitry 102 may be formed on the back side of an integrated circuit. FIG. 3 shows a cross-sectional side view of a single-chip package 200 that includes integrated circuit die 10 with different types of routing paths formed at the front and back sides. Integrated circuit 10 may include a semiconductor substrate 202 (e.g., a p-type substrate) having a front surface 204 and a back surface 206, a first dielectric stack 208 formed on the front surface of substrate 202, and a second dielectric stack 210 formed on the back surface of substrate 202. Dielectric stacks 208 and 210 may include interconnect routing structures and may therefore sometimes be referred to as first and second interconnect stacks, respectively. Circuitry such as transistors, diodes, resistors, capacitors, and other active/passive devices may be formed in the front surface of substrate 202.

First dielectric stack 208 may include multiple dielectric layers (sometimes referred to as "redistribution" layers or "metallization" layers) through which metal routing paths and conductive via structures can be formed. Routing structures formed in stack 208 may serve to route data signals, control signals, and other user signals to the circuitry at the front surface of substrate 202. A relatively small portion of routing paths formed in stack 208 should be dedicated to delivering power to the circuitry in device 10.

Second dielectric stack 210 may also include multiple dielectric layers through which metal routing paths and conductive via structures can be formed. The number of dielectrics in stacks 208 and 210 may be the same or may be different. Routing structures formed in stack 210 may serve to route positive power supply voltage Vcc, ground power supply voltage Vss, overdriven voltage signals (e.g., signals greater than Vcc), negative power supply voltage signals, and other power supply voltage signals to the circuitry formed at the front surface of substrate 202. While a minimal portion of routing paths in stack 208 serves to route power supply signals, most if not all the routing paths in backside stack 210 are used for routing power supply voltage signals.

If desired, circuitry formed on the front side and circuitry formed on the back side may be fabricated using different process technologies. For example, active circuitry such as transistors formed at the front side of die 10 may be fabricated using the newest processing technology for optimal performance, whereas power supply routing structures formed at the back side of die 10 may be fabricated using a relatively older processing technology to help reduce cost.

As shown in FIG. 3, die 10 may be mounted on a package substrate 220. In particular, the power supply routing structures in stack 210 may be coupled to package substrate 220 via an array of solder bumps 222. Bumps 222 may be formed on the outermost layer of stack 210 (e.g., bumps 222 may be deposited on aluminum pads in stack 210). Bumps 222 that interface directly with package substrate 220 may sometimes be referred to as controlled collapse chip connection (C4) bumps and may each have a diameter of 100 μm (as an example).

On the front side, the user signal routing structures in stack 208 may be coupled to traces on package substrate 220 via bonding wires 224. In particular, wires 224 may each have a first end that is coupled to a corresponding wire bond pad formed at the periphery of the outermost layer in stack 208 and a second end that is coupled to a corresponding wire bond pad formed on package substrate 220. Coupled in this way, user signals may be routed on and off chip via bond wires 224.

The example of FIG. 3 in which user signal interconnect stack 208 is coupled to package substrate 220 via wires 224 and power supply interconnect stack 210 is coupled to package substrate 220 via solder bumps 222 is merely illustrative and does not serve to limit the scope of the present invention. If desired, the orientation of integrated circuit 10 may be flipped so that user signal interconnect stack 208 is coupled to package substrate 220 via solder bumps 222 while power supply interconnect stack 210 is coupled to package substrate 220 via wires 224. In general, other suitable ways for coupling routing paths formed on both sides of die 10 to package substrate 220 may also be implemented.

Figure 4:
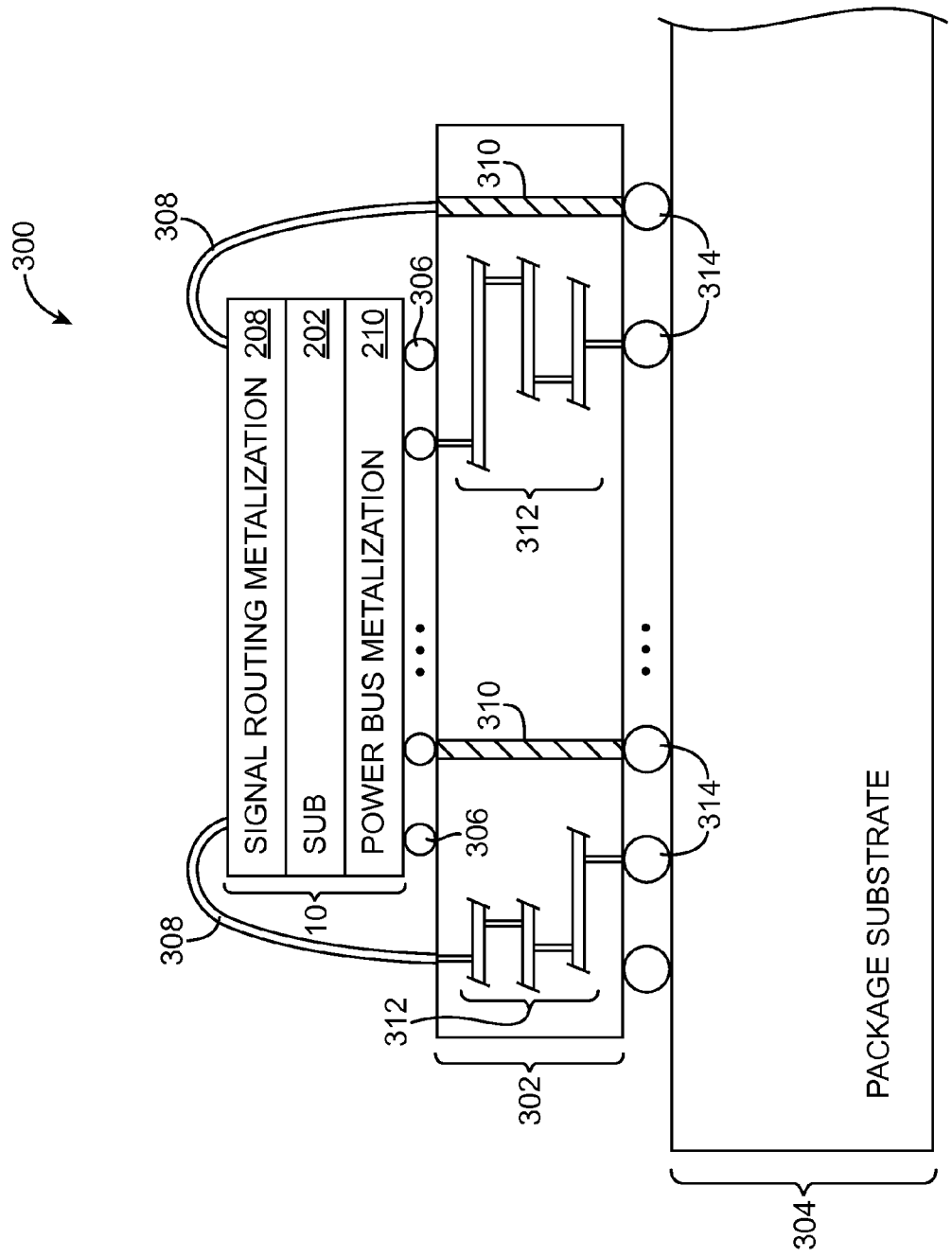
FIG. 4 is a cross-sectional side view of an integrated circuit of the type shown in FIG. 3 being mounted on an interposer in accordance with an embodiment.

In another suitable arrangement, an interposer structure such as structure 302 may be interposed between die 10 and package substrate 304 in integrated circuit package 300 (see, e.g., FIG. 4). In particular, the routing structures in stack 208 may be coupled to interposer 302 via bonding wires 308, whereas the routing structures in stack 10 may be coupled to interposer 302 via an array of microbumps 306. Microbumps 306 may refer to solder bumps that are formed on the outermost layer of interconnect stack 210 (e.g., solder bumps deposited on microbump pads in stack 210). Microbumps 306 may each have a diameter of 10 μm (as an example) and are generally smaller in size relative to C4 bumps.

Interposer 302 may be coupled to package substrate 304 via an array of C4 bumps 314. The minimum distance or "pitch" between adjacent microbumps 306 may be substantially smaller than the minimum pitch separating adjacent C4 bumps. The use of microbumps 306 may therefore help improve the number and complexity of connections that can be made to routing paths in stack 210, which can help lower the IR (potential) drop associated with power supply signals that are provided to die 10.

As shown in FIG. 4, interposer 302 may include interposer through-silicon via (TSV) structures 310 and interposer interconnect routing paths 312 that are used to connect die 10 to solder bump 314. Vias 310 may be formed through a "core" silicon layer within interposer 302 (not shown). The core layer may serve to provide rigid mechanical support for interposer 302. Interposer through-silicon vias 310 may be formed from copper, tungsten, aluminum, or other suitable conductive materials, may have diameters ranging from 1-10 μm, and may have lengths that are equal to the thickness of interposer substrate 112 (e.g., lengths ranging from 10-100 μm, depending on the thickness of substrate 112). As an example, a TSV 310 may have a first end that is directly coupled to a microbump 306 and a second end that is directly coupled to C4 bump 314 (e.g., TSV 310 may be used to supply power supply voltage signals to die 10). As another example, a TSV 310 may have a first end that is directly coupled to a bond wire 308 and a second end that is directly coupled to C4 bump 314 (e.g., TSV 310 may be used to supply toggling user data and control signals to die 10).

Interposer 302 may include multiple routing layers. Interconnect routing paths 312 may include metal routing paths and conductive vias formed in the different routing layers in interposer 302. In comparison to TSVs 310, interposer routing paths 312 may exhibit higher resistances but may provide more flexible routing options (i.e., routing paths 312 may perform not only vertical routing but also horizontal/lateral routing). As an example, routing path 312 may be used to connect wire 308 to at least one solder bump 314 (e.g., routing path 312 may serve to convey user signals to and from die 10). As another example, routing path 312 may be used to connect microbump 306 to at least one solder bump 314 (e.g., routing path 312 may serve to supply power to die 10).

The use of interposer 302 may allow package 300 to include multiple dies. Having more than one integrated circuit die in a multichip package may help increase the performance of die-to-die interface (e.g., driving signals from one die to another within a single multichip package is substantially easier than driving signals from one package to another, thereby reducing power consumption of associated input-output buffers), may free up input-output pins (e.g., input-output pins associated with die-to-die connections are much smaller than pins associated with package-to-board connections), and may help simplify printed circuit board (PCB) design (i.e., the design of the PCB on which the multi-chip package is mounted during normal system operation). In general, one or more dies may be mounted horizontally with respect to one another on interposer 302 (sometimes referred to as 2.5D stacking) and/or multiple dies may be stacked vertically with respect to one another over interposer 302 (sometimes referred to as 3D stacking).

Figure 5:
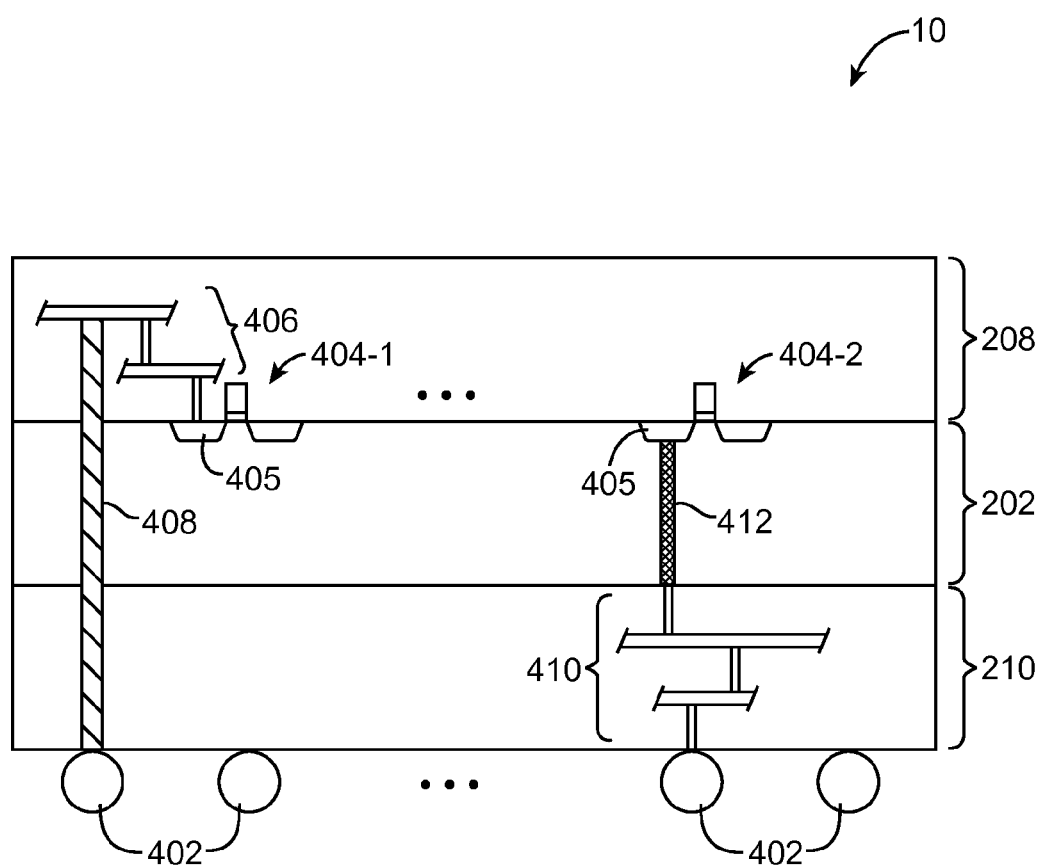
FIG. 5 is a cross-sectional side view of an integrated circuit showing how power can be routed from the back side of the integrated circuit to the front side of the integrated circuit in accordance with an embodiment.

FIG. 5 shows different ways in which power can be delivered from the back side of die 10 to the front side of die 10. As shown in FIG. 5, a first transistor 404-1 and a second transistor 404-2 may be formed in the front surface of substrate 202. Each of transistors 404-1 and 404-2 may include two source-drain terminals 405 (as an example). In one embodiment, power supply signals may be routed from bump 402 (e.g., a microbump or a C4 bump) to transistor 404-1 through an integrated circuit die through-silicon via 408 and metal routing paths 406 formed in front-side dielectric stack 208.

In another suitable embodiment, power supply signals may be routed from bump 402 to transistor 404-2 through metal routing paths 410 formed in backside dielectric stack 210 and bulk via structure 412. Bulk via structure may have a first end that directly contacts a source-drain diffusion region 405 of transistor 404-2 and a second that that terminates at the back surface of substrate 412. The second end of via 412 may be coupled to metal routing paths 410 (e.g., the second end of via 412 may terminate at the back surface of substrate 202). Via 412 formed in this way may sometimes be referred to as a "nether" contact. The use of bulk nether contacts 412 obviates the need for any additional power bus routing to be formed in stack 208.

Figure 6:
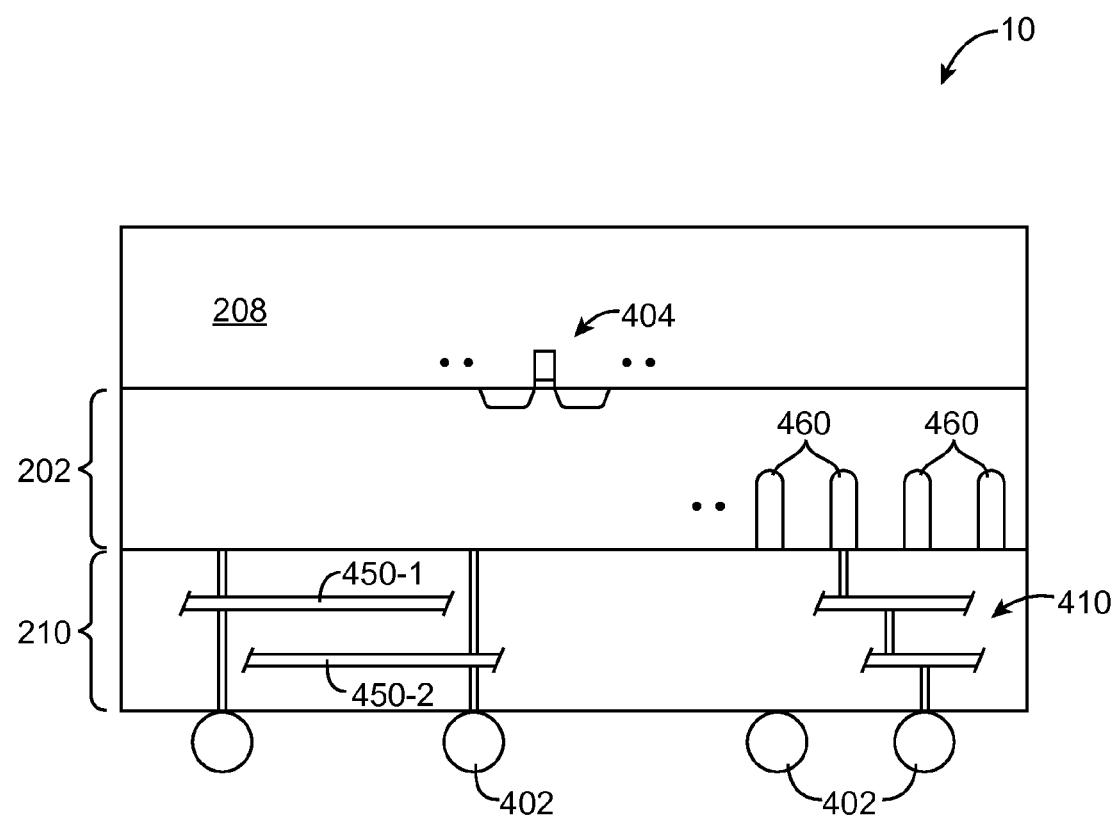
FIG. 6 is a cross-sectional side view of an integrated circuit showing how decoupling capacitor structures can be formed on the back side of the integrated circuit in accordance with an embodiment.

FIG. 6 shows another suitable arrangement in which on-die decoupling capacitor circuitry is formed on the back side to die 10. As shown in FIG. 6, a first conductive member 450-1 may be formed in a first metal layer in stack 210 and a second conductive member 450-2 may be formed in a second metal layer in stack 210. The first and second conductive members 450-1 and 450-2 may be elongated metal paths, rectangular plates, or other conductive structures that serve as opposing parallel conductors for a decoupling capacitor. In general, it may be desirable to form conductors 450-1 and 450-2 in consecutive metal routing layers in stack 210 so as to maximize the amount of capacitance provided.

Decoupling capacitors may also be formed as trench capacitors in the back surface of die substrate 202. In the example of FIG. 6, deep trench capacitors 460 may be formed in the back surface of substrate 202. Trench capacitors 460 may be coupled to bump 402 or other power routing buses in die 10 to provide additional decoupling capacitance. Use of trench capacitors on the back side of die 10 may be an efficient way of providing decoupling capacitance without taking up too much horizontal space and without interfering with power bus routing in stack 210, and can thereby reduce the number of layers required for stack 210. Forming decoupling capacitive structures at the back side may be an effective way of providing additional capacitance without displacing transistor area at the front side.

Figure 7:
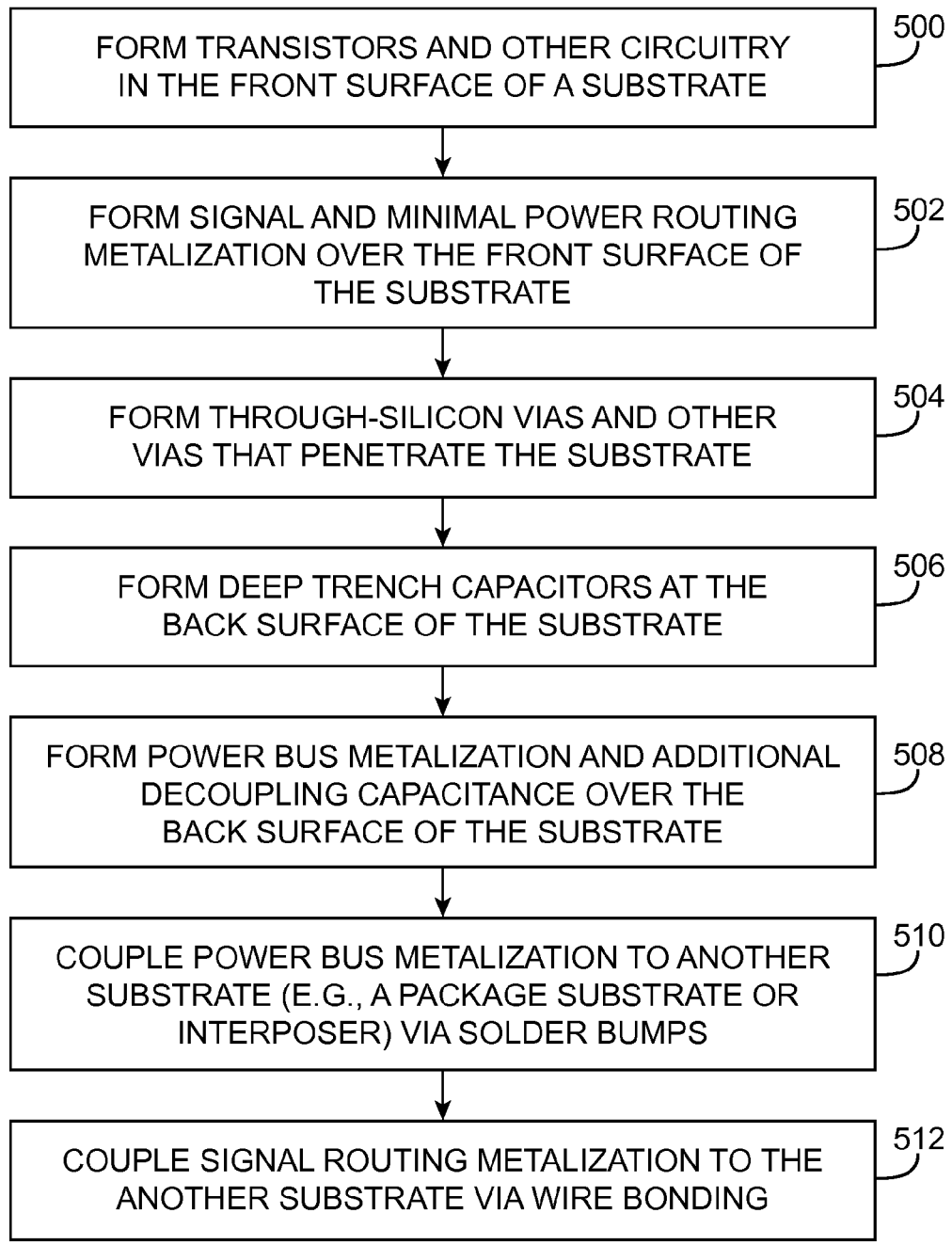
FIG. 7 is a flow chart of illustrative steps for forming an integrated circuit of the type described in connection with FIGS. 3-6 in accordance with an embodiment.

FIG. 7 is a flow chart of illustrative steps for fabricating an integrated circuit package that is provided with front-side user signal routing and backside power routing. At step 500, transistors and other circuitry may be formed in the front surface of substrate 202. At step 502, signal metallization layers 208 may be formed over the front surface of substrate 202.

At step 504, IC die through-silicon vias 408, through-bulk vias 412, and other conductive vias that penetrate substrate 202 may be formed (see, e.g., FIG. 5). At step 506, deep trench capacitive structures 460 may be formed at the back surface of substrate 202 (see, e.g., FIG. 6). If desired, steps 504 and 506 may be performed prior to step 502 or even prior to step 500.

At step 508, power bus metallization layers 210 that include power supply voltage signal routing paths and additional decoupling capacitive structures 450 may be formed over the back surface of substrate 202. A die formed in this way may then be mounted on a substrate (e.g., a package substrate or an interposer substrate). In particular, the power metallization layers 210 may be coupled to the substrate via solder bumps (e.g., via microbumps or C4 bumps), as shown in step 510. The signal metallization layers 208 may be coupled to the substrate via wire bonding (step 512).

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit package, comprising:
a first substrate; and
an integrated circuit mounted on the first substrate, wherein the integrated circuit comprises:
a second substrate having front and back surfaces;
a first interconnect stack that is formed on the front surface of the second substrate and that routes user signals to transistor structures formed at the front surface of the second substrate; and
a second interconnect stack that is formed on the back surface of the second substrate and that only includes circuitry that routes power supply signals to the transistor structures formed at the front surface of the second substrate during a period of time of operation of the integrated circuit, wherein the user signals are different than the power supply signals during the period of time.

2. The integrated circuit package defined in claim 1, further comprising:
bonding wires that are coupled between the first interconnect stack and the first substrate.

3. The integrated circuit package defined in claim 2, further comprising:
solder bumps formed between the first substrate and the integrated circuit.

4. The integrated circuit package defined in claim 1, wherein the first substrate comprises an interposer, the integrated circuit package further comprising:
a package substrate on which the interposer is mounted; and
an additional integrated circuit mounted over the interposer.

5. The integrated circuit package defined in claim 1, further comprising:
decoupling trench capacitors formed in the back surface of the second substrate.

6. The integrated circuit package defined in claim 1, further comprising:
a first conductor formed in a first routing layer in the second interconnect stack; and
a second conductor formed in a second routing layer in the second interconnect stack, wherein the first and second conductors serve as a decoupling capacitor for the integrated circuit.

7. The integrated circuit package defined in claim 1, further comprising:
a through-silicon via that is formed through the second substrate and that delivers power supply signals to the transistor structures.

8. The integrated circuit package defined in claim 1, further comprising:

a transistor that is formed at the front surface of the second substrate and that includes at least one source-drain diffusion region formed in the front surface of the second substrate; and a through-bulk via that is formed in the second substrate, wherein the through-bulk via has a first end that directly contacts the source-drain diffusion region of the transistor and a second end that contacts the back surface of the second substrate.

9. A method of forming an integrated circuit package, comprising:

forming transistors at a front surface of a substrate;

forming a first dielectric stack on the front surface of the substrate, wherein the first dielectric stack includes circuitry that routes user signals to the transistors; and forming a second dielectric stack on a back surface of the substrate, wherein the second dielectric stack includes only circuitry that routes power supply signals to the transistors during a period of time of operation of the integrated circuit package, and wherein the user signals are different than the power supply signals during the period of time.

10. The method defined in claim 9, wherein forming the transistors comprises forming the transistors using a first process technology, and wherein forming the second dielectric stack comprises forming the power supply routing circuitry using a second process technology that is older than the first process technology.

11. The method defined in claim 9, further comprising:

wire bonding the first dielectric stack to an additional substrate; and forming solder bumps between the second dielectric stack and the additional substrate.

12. The method defined in claim 9, further comprising:

forming deep trench capacitors in the back surface of the substrate.

13. The method defined in claim 9, further comprising:

forming a conductive via structure in the substrate, wherein the conductive via structure has a first end that directly contacts a diffusion region associated with one of the transistors and a second end that is coupled to the power supply routing circuitry in the second dielectric stack.

14. An integrated circuit, comprising:

a substrate having first and second surfaces;

a transistor formed at the first surface of the substrate;

an interconnect stack that is formed on the second surface of the substrate and that includes only power supply routing circuitry;

an additional interconnect stack that is formed on the first surface of the substrate and that includes user signal routing circuitry that is connected to a gate terminal of the transistor; and a via structure formed in the substrate, wherein the via structure has a first end that directly contacts a source-drain region of the transistor and a second end that is coupled to the power supply routing circuitry, and wherein the via structure is not electrically connected to bumps formed on the additional interconnect stack.

15. The integrated circuit defined in claim 14, further comprising:

decoupling capacitors formed in the second surface of the substrate.

16. The integrated circuit defined in claim 15, wherein the decoupling capacitors comprise trench capacitors.

\* \* \* \* \*